US008686713B2

(12) United States Patent
Cargill, III

(10) Patent No.: US 8,686,713 B2
(45) Date of Patent: *Apr. 1, 2014

(54) IN-WATER VOLTAGE GRADIENT DETECTOR

(71) Applicant: George S. Cargill, III, Athens, NY (US)

(72) Inventor: George S. Cargill, III, Athens, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/073,966

(22) Filed: Nov. 7, 2013

(65) Prior Publication Data
US 2014/0062708 A1    Mar. 6, 2014

Related U.S. Application Data

(63) Continuation-in-part of application No. 13/794,912, filed on Mar. 12, 2013, now Pat. No. 8,643,360.

(60) Provisional application No. 61/696,204, filed on Sep. 2, 2012.

(51) Int. Cl.
*G01R 31/30* (2006.01)
*G01R 15/22* (2006.01)

(52) U.S. Cl.
CPC ........... *G01R 31/30* (2013.01); *G01R 15/22* (2013.01)
USPC ............................................. 324/96

(58) Field of Classification Search
CPC ............................. G01R 31/30; G01R 15/22

USPC ............................................. 324/96
See application file for complete search history.

(56) References Cited

U.S. PATENT DOCUMENTS

| 3,662,260 | A | * | 5/1972 | Thomas et al. | 324/72 |
| 5,289,133 | A | * | 2/1994 | Kolz | 324/444 |
| 5,410,246 | A | * | 4/1995 | Cornwall et al. | 324/96 |
| 7,253,642 | B2 | * | 8/2007 | Kalokitis et al. | 324/686 |

OTHER PUBLICATIONS

Online Electronics, Ltd., Voltage Gradient Probe, Jan. 26, 2012.*

* cited by examiner

*Primary Examiner* — Jeff Natalini
(74) *Attorney, Agent, or Firm* — Michael J. Weins; Jeffrey E. Semprebon

(57) ABSTRACT

A voltage gradient detector provides notice when a potentially hazardous voltage gradient is present in water, employing at least one pair of spaced-apart electrodes connected to an LED. The electrode spacing is selected such that, when exposed to a sufficiently large voltage gradient, the voltage between the electrodes causes activation of the LED. The LED can provide visual illumination, or can be a part of a switching device such as a photoMOS relay that in turn activates an alarm device such as an audible sounder or a high-intensity light. Sensitivity in multiple directions can be attained by employing a pair of LEDs between the electrodes, and by employing three pairs of electrodes and associated LED pairs, with the pairs of electrodes being spaced apart along substantially orthogonal axes. These pairs may be discrete or may share an electrode in common.

15 Claims, 10 Drawing Sheets

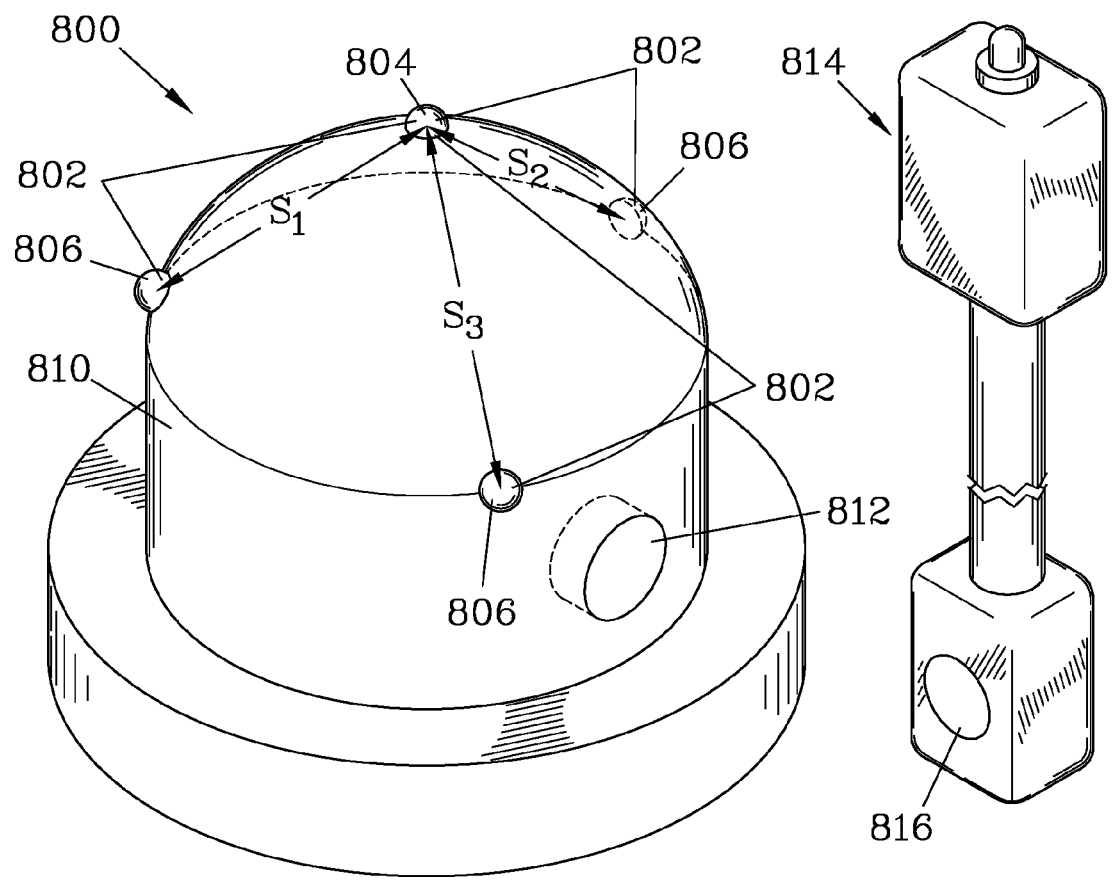
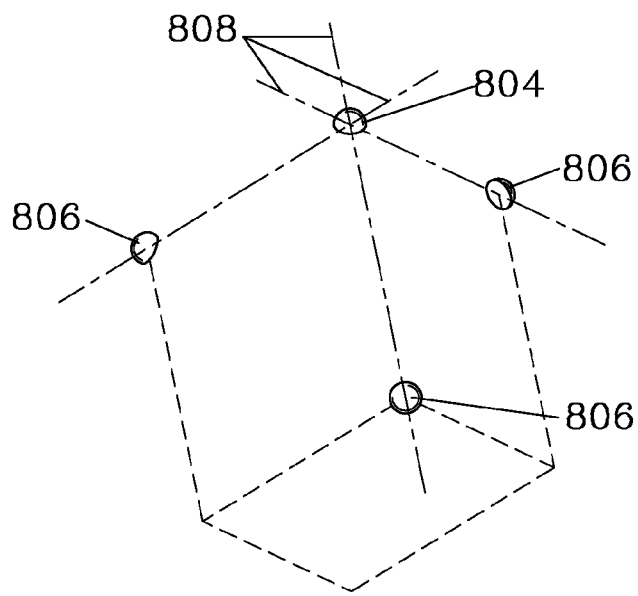
Figure 14
Figure 15

IN-WATER VOLTAGE GRADIENT DETECTOR

FIELD OF THE INVENTION

The present invention provides a voltage gradient detector for providing notice of the presence in water of a voltage gradient greater than a specified strength.

BACKGROUND OF THE INVENTION

Electrical gradients in water can create risks of electrocution and electroshock drowning if an individual enters water in which a sufficiently strong voltage gradient is present. Such hazardous conditions can occur in swimming pools, hot tubs, spas, and Jacuzzis which have improperly installed, poorly maintained, or otherwise faulty underwater lighting, heaters pumps, wiring, or other electrically operated equipment or appliances. Currently, protection against electrocution and electroshock drowning hazards in such facilities depends mainly upon the use of GFCI (ground fault circuit interrupter) circuit breakers being installed on AC power lines. However, such circuit breakers may not be present in older facilities, which are also subject to greater risk due to deterioration over time of wiring for underwater equipment. There are also possibilities of risk at locations in more open water, where voltage gradients may be present due to fallen electrical transmission lines, current leakage from boats, or other voltage sources.

One device that has been developed for providing an indication of AC voltage gradient strength in seawater is the Voltage Gradient Probe marketed by Online Electronics Ltd. of Aberdeen, Scotland, UK. This device is described as a hand-held, subsea unit for providing an easily interpreted indication of AC electric field strength in seawater to indicate to divers or ROVs the presence of any local AC electric fields while working on subsea electrical equipment. The device appears to be limited to active use, and detects only AC voltages. Furthermore, the device is described as having a typical battery life of 10 days, making it ill-suited for passively monitoring a location to provide a warning when a voltage gradient is present in the water at that location.

A less critical risk is caused by voltage gradients that cause increased corrosion of vessels or other equipment that are immersed in water where such a gradient is present. Such gradients can greatly accelerate damage due to electrolytic corrosion or galvanic corrosion, and thus detecting such gradients is of particular interest to operators of marinas and other areas where vessels are present.

SUMMARY OF INVENTION

The present invention is a device for monitoring voltage gradients in water, particularly to provide detection of such gradients so as to warn when a potentially dangerous gradient is present. One application that has particular utility is to provide notice to individuals that the water should not be entered because the gradient would place an individual therein in danger of death or serious injury. A rudimentary device which is well suited for placing an individual on notice of a hazardous voltage gradient has a pair of spaced-apart electrodes that are maintained at a separation S, and a light-emitting diode (LED) connected therebetween by a set of conductors.

The separation S and response characteristic of the LED are selected such that the LED emits light when the voltage difference between the two electrodes has reached or exceeded a target threshold level. Based on the minimum voltage gradient of concern, the separation S of the electrodes can be selected so that, in combination with the response characteristic of the LED, the LED illuminates to provide notice of an endangering level for individuals. Typically, for an LED having an activation voltage of $V_{LED}$ to provide notice of a minimum gradient of concern $G_{MIN}$, the separation S should be set such that:

$$S_{MIN} > V_{LED}/G_{MIN}$$

Typically, the LED is connected in series with a resistor to limit current, in which case the voltage between the electrodes that is needed to illuminate the LED is an effective activation threshold voltage $V_T$, and this activation voltage is used to determine the minimum separation. This threshold voltage $V_T$ includes the LED activation voltage $V_{LED}$ as well as the voltage drop across the resistor under the minimum activation current for the LED (the current draw of the LED at the minimum activation voltage $V_{LED}$). To maintain the sensitivity of the gradient detector in such cases, the resistance value of the resistor is selected so that, when the resistor is in series with the LED, the resistor results in only a small increase in the voltage gradient needed to illuminate the LED.

To assure a set separation S and that the potential experienced by the LED is measured between the electrodes, the electrodes can be mounted to the extremities of a spacer. The spacer can be hollow so as to provide a watertight central cavity that provides a sealed passageway for the set of conductors that connect the electrodes to electrical contacts of the LED. Providing a sealed housing for the conductors and the electrical contacts of the LED serves to electrically isolate these elements from the water when the voltage gradient detector is in service, thereby assuring that any voltage gradient along the length of the spacer is experienced as a potential between the electrodes. It should be appreciated that the conductors connecting the electrodes to the contacts of the LED could be run external to the body if the conductors and their connections to the electrodes and electrical contacts of the LED are isolated by watertight casings, in which case the spacer need not be hollow.

Since the LED is responsive to only one polarity of the voltage gradient, when the voltage to be detected is DC, it is preferred to use pairs of opposed LEDs so that either polarity of the voltage gradient can be monitored without requiring a user to reorient the device. This arrangement allows the device to effectively monitor either an increase or a decrease in potential with regard to the X direction, since a positive gradient in one direction causes a positive voltage difference between the electrodes to illuminate one LED, while a voltage gradient in the opposite direction illuminates the other LED that is connected in parallel to the same electrodes, but in reverse. The LEDs could be different colors to allow a user to readily determine the voltage gradient direction. The use of such paired LEDs should also better indicate when an AC voltage gradient is present, since both LEDs will be illuminated in this case. The pair of LEDs could be provided by a single bi-color LED unit that generates red light for a DC voltage in one polarity, green light for DC voltage in the opposite polarity, and apparent yellow light for AC voltage.

For personal safety applications, where the voltage gradient of concern has been found to be 2V/foot, the minimum separation S of the electrodes to provide the threshold voltage for activating LEDs (which is typically 1.6V) is in the neighborhood of 8-9 inches; however, it may be desirable to increase this distance to provide a margin of safety. When the separation S is set to provide a sufficient voltage to illuminate the LEDs, there is no need to amplify the voltage, and such devices can operate without the need for external power, with the LED powered only by the voltage gradient in the water.

In addition to employing a series resistor, the likelihood of burning out the LED(s) can be further reduced by providing a Zener-diode-based voltage limiter between the electrodes and the LEDs to prevent voltages applied to the LEDs from reaching or exceeding levels that would cause burnout or other damage to the LEDs. Typically, such a voltage limiter employs a pair of reversed Zener diodes connected in series with a resistor to provide protection for AC voltage gradients and/or for DC voltage gradients in either direction with respect to the electrodes.

The above devices require no power to provide a visible signal. However, when only the gradient itself is used to power the device, the intensity of the signal (the visible light emitted) is relatively small and requires direct observation to detect the presence of a gradient.

When a stronger visual signal is sought, or when a non-visual signal such as an audio warning or a transmitted signal warning is desired, the LED can be provided as part of a photoMOS relay for closing a switch that can either activate a brighter light, an audio alarm, and/or provide some other form of warning such as a transmitted message to a base receiver. These warning devices may require a significant amount of power, but only when activated. LED-based photoMOS relays are commonly available for use as opto-isolators. In this case, it would also be possible to employ an LED that emits light at a frequency in the infrared range, which typically allows a lower activation threshold voltage. When photoMOS relays are employed to switch on an alarm device, it may be desirable to also provide a pair of visible light LEDs to help the user identify whether the voltage gradient is due to DC or AC voltage, in order to aid in identifying the character of the voltage responsible for the gradient.

While the discussion of the use of the above device has been for detecting the presence of voltage gradients in water that could be potentially harmful to individuals, lower values of voltage gradients can be harmful to structures or vessels as a result of increased electrolytic corrosion action where the potential results from voltage (current) leakage from vessel to vessel or vessel to docking structure. While there is no bright line gradient level that results in such corrosion problem, significant corrosion risk can result from gradients that are in the neighborhood of 0.1V/ft to 1.0 V/ft. At even lower gradients, galvanic corrosion action can occur where the water allows a current to flow between dissimilar metals, creating a galvanic cell. Again, there is no bright line value where such corrosion becomes significant, but frequently such can be a problem when the gradient is in the neighborhood of 0.01V/ft to 0.1V/ft. To detect these lower-value gradients requires modification of the geometry of the device and/or additional elements to increase the voltage experienced by the LED(s).

Adjustment of the potential experienced by the LEDs can be done by changing the separation between the electrodes, in which case increasing the separation increases the voltage difference experienced by the LEDs for a particular gradient. Alternatively, the voltage experienced by the LEDs can be increased by using an amplifier to amplify the voltage present between the electrodes and providing the output of the amplifier to the LEDs. This option requires power to operate to the amplifier.

While the above discussion has been for devices which are designed to be responsive to a gradient in a direction selected by the user, it is frequently preferred to have a device with the ability to respond to voltage gradients with less dependency on the particular orientation of the electrodes. For such applications, three sets of orthogonal or substantially orthogonal sensor pairs can be employed. Such electrode pairs could be provided by discrete pairs of electrodes or by two or three of the pairs sharing an electrode in common, in which case the detector could employ as few as four electrodes. Having a common electrode shared by three pairs of electrodes may have particular benefit when the voltage is amplified, as it can allow a single multiple amplifier device to be used to simplify the circuitry needed to power the amplifiers. The use of a shared common electrode also assures that the sensitivity to gradients is with respect to a common point. An alternative to using a shared electrode would be to have one electrode from each pair connected by a common lead; however, to avoid creating the effect of reduced separation resulting from such a common connection, the connected electrodes should be located in close proximity to each other.

The angle between the axes along which the pairs are separated should be between 45° and 135°. To reduce dependency on the direction of a voltage gradient that may be present, the angles between the axes of separation should preferably be within about 10° of 90°. In situations where the pairs are separated along axes that are skewed, rather than intersecting, the angle between any two axes in question can be defined as the angle between one axis and a vector that is parallel to the other axis and intersecting the first.

These devices can be floating devices which do not require interaction with a user, and such devices have particular utility for determining voltage gradients in a confined volume such as a pond or a pool. For use in ponds, the structure for holding the electrode pairs at a separation can be shrouded so as not the be snagged by debris if the device is floated. When the device is floated, ballast may be desirable so as to avoid overturning in the water as the device moves about.

Similarly, the detector could be configured as a submersible device that rests on the bottom of a body of water, is secured to an anchor or underwater structure, is affixed to the hull of a boat, or is attached to a submersible device such as a pool-cleaning vacuum device such that the entire device, or the sensors of the device, are located at a selected depth below the surface of the body of water.

For other applications, it is frequently advantageous to provide a hand-operated device, that can sense gradients in three orthogonal directions. To facilitate location of the source of the gradient, it may be preferred to have the electrode pairs arranged such that one pair is separated along a substantially vertical axis, while the other two pairs define a substantially horizontal plane, and to have separate LEDs to indicate the presence of a voltage gradient along each of these three axes. In one embodiment, such a device has an extender between the electrode pairs and a grip portion that is held by the user, allowing the user to readily immerse the electrode pairs. A hand-held device has particular utility when monitoring gradients in the vicinity of a vessel and/or a stationary structure in the water, such as a dock, to detect gradients likely to cause accelerated corrosion damage. As discussed above, the gradients of concern in such cases can be substantially lower than those which endanger a person, and there is no critical value below which there is no corrosion. For such use, the device can be fitted with switches and contacts can be attached to the electrodes to allow the LEDs to be disconnected from the electrodes and to allow a voltmeter to be attached in place of the LEDs. Having this capacity allows the user to measure the gradient and thus to evaluate the severity of the corrosion problem and the need for prompt attention to correct the problem. When amplifiers are employed to increase the voltage experienced by the LEDs, it may also be desirable to provide a switch to allow the LEDs to receive either the output from the amplifiers or the unamplified voltages across the electrode pairs.

BRIEF DESCRIPTION OF THE FIGURES

FIG. 14 is an isometric view of a voltage gradient detector that forms another embodiment of the present invention, and which is designed to be submerged when in service. The detector again has three pairs of electrodes that share a common electrode and are separated along orthogonal axes, but in this embodiment the axes are inclined with respect to the horizontal plane and vertical axis. Because it is designed to be submerged when in service, an ultrasonic transmitter is employed to provide a warning of the presence of a voltage gradient, the ultrasonic transmitter generating a signal that is received by a remote receiver with a submerged ultrasonic sensor and which, in turn, provides an audible or visible alarm in response.

FIG. 15 is a diagram of the electrodes of the embodiment shown in FIG. 14, illustrating their positions at four adjacent corners of a cube.

DETAILED DESCRIPTION OF THE PREFERRED EMBODIMENTS

Figure 1:
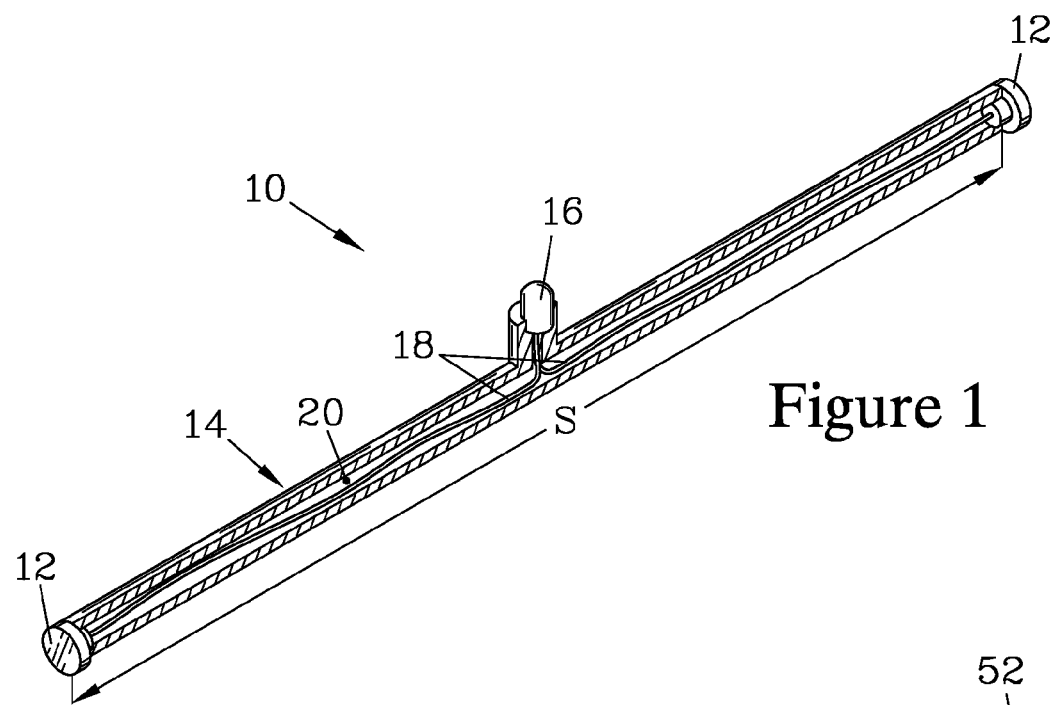
FIG. 1 is a section view of one embodiment of the present invention which employs a single visible-light LED to monitor the voltage difference between a pair of electrodes maintained at a fixed separation S. In this embodiment, the separation S is selected to provide a target threshold level for the voltage differential between the electrodes which results in illumination of the LED.

FIG. 1 is an isometric view of one embodiment of an in-water voltage gradient detector 10 of the present invention. For reasons discussed below, the gradient detector 10 has characteristics that make it suitable for providing notice to an individual when the voltage gradient in the direction measured is above a threshold level where an individual entering the water would be likely to be harmed by the voltage gradient. The device 10 has a pair of spaced apart electrodes 12 that are maintained at a separation S by a hollow spacer 14, to which the electrodes 12 are sealably attached.

An LED 16 resides between the electrodes 12, and is sealably attached to the spacer 14 such that its electrical contacts can be connected to the first pair of electrodes 12 by a pair of conductors 18. The sealable attachment of the electrodes 12 and the LED 16 to the spacer 14 serves to electrically isolate the electrodes 12 from each other, except for their connection through the LED 16 via the conductors 18. The spacer 14 has a central cavity 20 through which the conductors 18 are strung The conductors 18 connect to the LED 16 such that, when a voltage difference is maintained between the two electrodes 12, the LED 16 experiences the voltage difference. The sealable attachment of the electrodes 12 and the LED 16 to the spacer 14 serves to encapsulate the central cavity 20 to isolate it from the water, and thus the electrical connection between the electrodes 12 and the electrical connectors of the LED 16 is electrically isolated from the water.

When this device is placed in water having a voltage gradient of magnitude G and orientation in the direction of the measurement such that the voltage difference exists between the electrodes 12, the LED 16 is subject to a potential and, if this potential exceeds a target threshold for activation, the LED 16 illuminates; this threshold voltage for activation results from the electrodes 12 being at the threshold potential and, since the electrode separation S is known, the voltage gradient can be calculated.

$$V_{ELECTRODES} = G*S$$

If the activation voltage $V_{LED}$ of the LED 16 is known, the separation S can be set such that $V_{ELECTRODES} \geq V_{LED}$ to cause illumination of the LED 16 when the voltage gradient reaches the danger value, and thus illumination of the LED 16 provides notice that it is unsafe to enter the water.

For example, according to one source, an AC voltage gradient of 2V/foot is sufficient to create a risk of harm to an individual in the water. For a detector employing a visible red LED with an activation threshold voltage $V_{LED}$ of 1.6 volts, a separation S between the electrodes of 0.8 feet should result in illumination of the LED when such a voltage gradient is present and aligned along the separation of the electrodes; various embodiments discussed below illustrate how the limit of directionality can be overcome. To provide a margin of safety, it may be desirable to set the critical voltage gradient to be detected somewhat lower, and thus to place the electrodes at a greater separation. In the above example, in order to detect a voltage gradient at 50% of the value calculated to cause a risk, the electrode separation would be doubled to 1.6 feet so as to cause illumination of the LED when the electrodes are exposed to a voltage gradient of 1V/foot.

Figure 2:
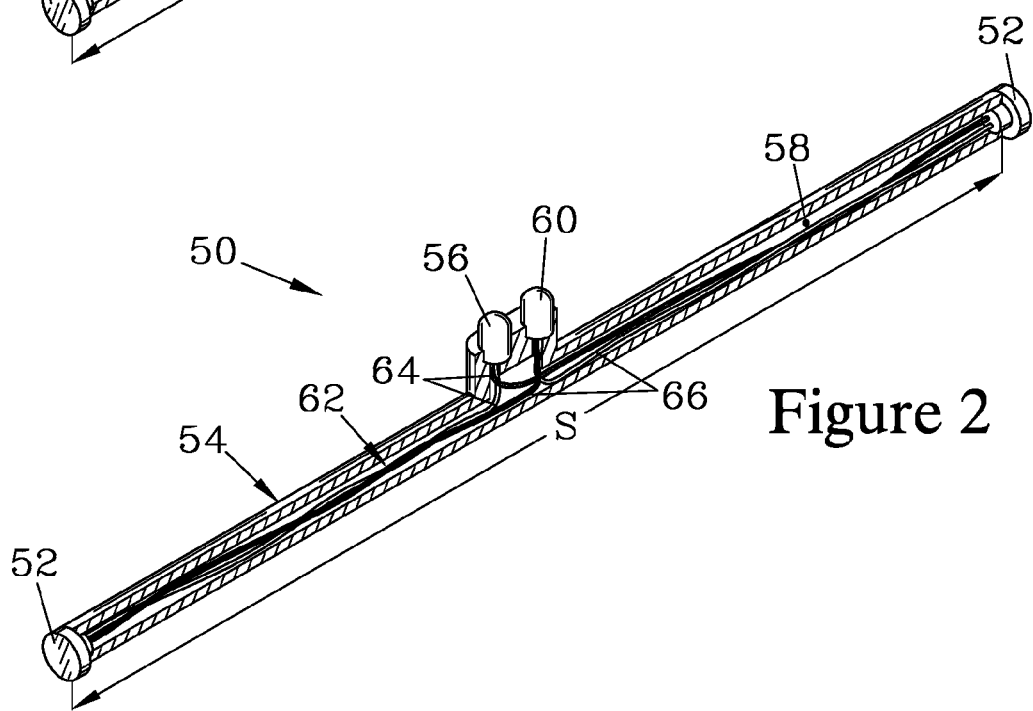
FIG. 2 is a section view of an embodiment similar to the embodiment of FIG. 1, but which employs a pair of LEDs connected in parallel with reverse polarity so that voltage gradients can be monitored in either direction, and to more clearly indicate the presence of an AC voltage gradient.

FIG. 2 is a section view of a gradient detector 50 that is similar to the gradient detector 10 shown in FIG. 1, but where the response is less dependent on the direction of the gradient, and where the detection of AC voltage gradients is enhanced. The detector 50 again has a pair of electrodes 52 which are spaced apart at a separation S by a hollow spacer 54. A first LED 56 is attached and sealed to the spacer 54 and communicates with a central cavity 58 in the spacer 54. This central cavity 58 also communicates with the electrodes 52. In the gradient detector 50, a second LED 60 is provided which also attaches to the spacer 54 and communicates with the central cavity 58. The LEDs (56, 60) are connected to the electrodes 52 by a set of conductors 62 that includes a first pair of conductors 64 that electrically connects the first LED 56 to the first pair of electrodes 52, and a second pair of conductors 66 that connects the second LED 60 to the first pair of electrodes 52, but with its polarity reversed from that of the first LED 56. Having the first LED 56 and the second LED 60 connected in parallel but with their polarity opposite with respect to the electrodes 52 allows the gradient detector 50 to detect either a positive or negative potential between the electrodes 52 with respect to a particular orientation if the voltage source is DC. If the source is AC, then both LEDs illuminate, and for 60 cycle AC, the combined appearance of a red LED and a green LED provides an appearance of a continuous light that is yellow if the LEDs are closely spaced; such close spacing can be conveniently provided by a bi-color LED that includes a red LED and a green LED in a single package.

Figure 3:
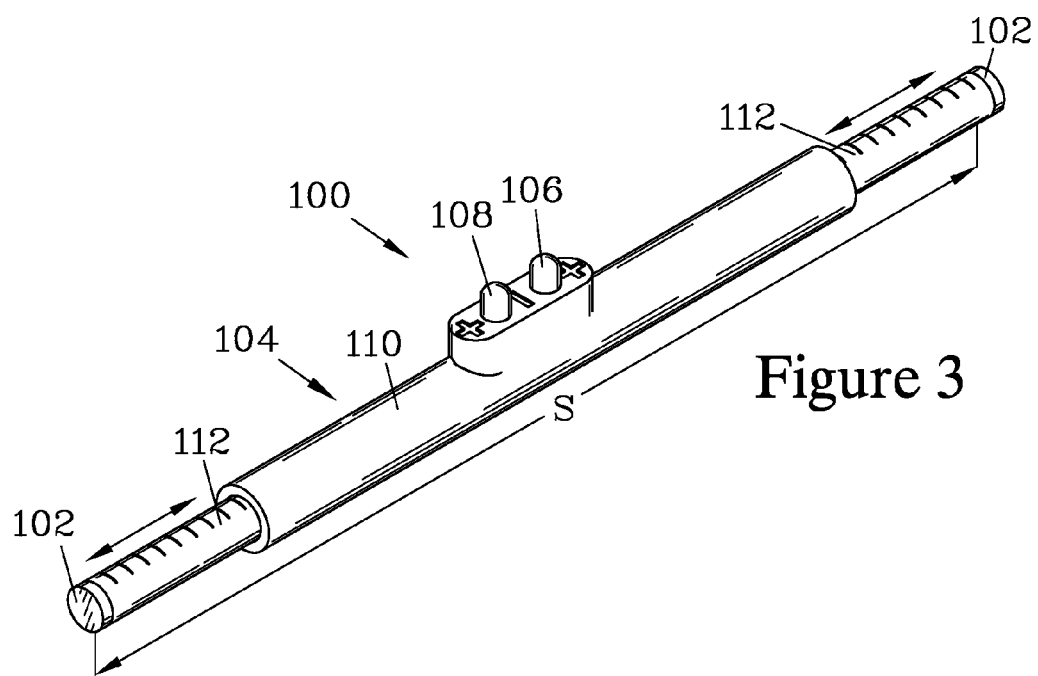
FIG. 3 is an isometric view of an embodiment where the separation S between the electrodes can be adjusted which, in turn, allows one to adjust the voltage generated between the electrodes for a particular gradient. This allows the user to increase the separation S, thereby increasing the voltage until it is sufficient to light one of the LEDs. In some embodiments, it may be preferred to have the separation S small to avoid a voltage difference large enough to damage the LEDs and have the user adjust the distance until the LEDs illuminate; then, knowing the separation, the user can determine the voltage gradient.

FIG. 3 is an isometric view of an in-water voltage gradient detector 100 which includes the features of the gradient detector 50 shown in FIG. 2, but which allows varying the separation S between a pair of electrodes 102. The electrodes 102 are attached to a hollow spacer 104, to which a first LED 106 and a second LED 108 are also attached. The gradient detector 100 differs from the embodiments described above in that the device is tunable with respect to the gradient that will be effective for providing notice of its presence. This is accomplished by providing the spacer 104 with a central portion 110 that is slidably and sealably engaged by a pair of extensions 112 on which the electrodes 102 are affixed. The slidable engagement of the extensions 112 with the central portion 110 allows the separation S between the electrodes 102 to be adjusted, and thus adjust the gradient that results in illumination of at least one of the LEDs (106, 108).

In some embodiments, it may be preferred to have the separation S small so as to avoid a voltage difference large enough to damage the LEDs, and have the user adjust the distance until the LEDs illuminate. In such cases, knowing the separation, the user can determine the voltage gradient. Another benefit from having the separation variable is it allows the spacing to be increased, and thus allow activation of the LEDs at lower gradients. In some cases, this may allow one to determine the presence of gradients that could result in increased risk of electrolytic corrosion.

Figure 4:
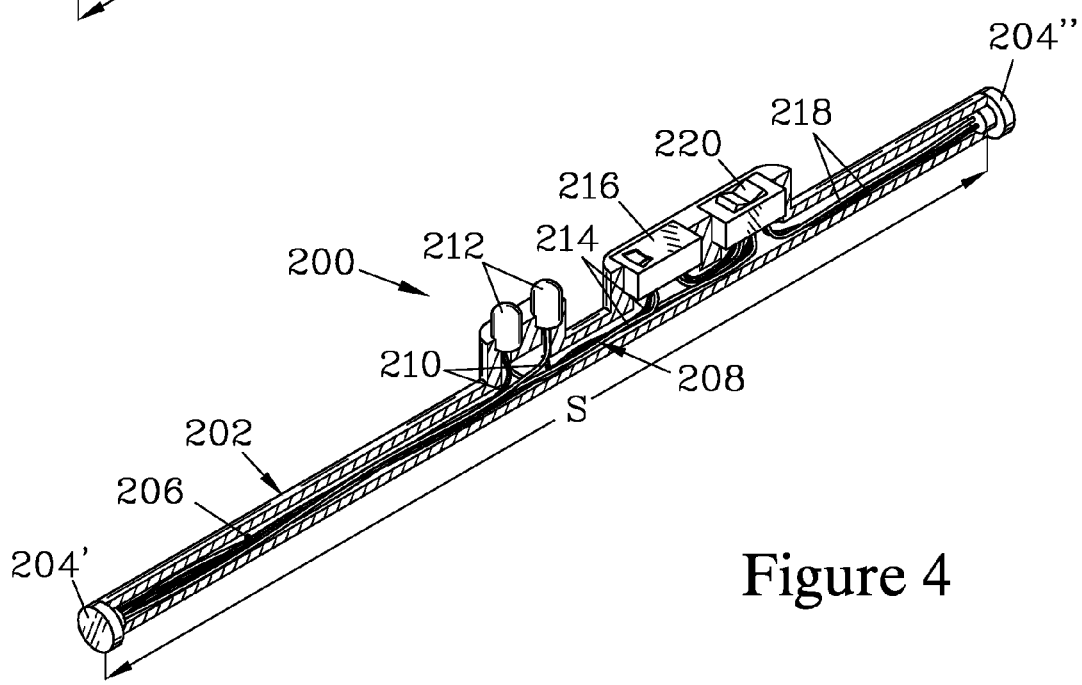
FIG. 4 is a sectioned view of an embodiment that provides a secondary set of wiring and a switch that disconnects the electrodes from the LEDs and instead connects them to a voltmeter so that the voltage between the electrodes can be measured.

FIG. 4 is an isometric view of a gradient detector 200 which again includes features of the gradient detector 50 illustrated in FIG. 2, but has the additional option of providing a measurement of the voltage. The gradient detector 200 has a hollow spacer 202 that fixes the separation S of a pair of electrodes 204', 204''. The spacer 202 has a central cavity 206 through which a bundle of conductors 208 can pass. One pair of conductors 210 in the bundle of conductors 208 connect the electrode 204' to a pair of reversed-polarity LEDs 212, while a second pair of conductors 214 connect the electrode 204' to a voltmeter 216. A third pair of conductors 218 connect between the electrode 204'' and a two-position switch 220. When the two-position switch 220 is in a first position, the electrode 204'' is connected to the LEDs 212, and when in the second position, the switch 220 connects the electrode 204'' to the voltmeter 216, allowing the voltage difference between the electrodes 204 to be measured, rather than merely being indicated as below or above a threshold level for activation of the LEDs 212. Such measurement can be particularly beneficial when monitoring for voltage gradients associated with corrosion, to provide the user a more sensitive indication to provide a basis for evaluating the seriousness of the corrosion risk.

The embodiments discussed above respond to voltage gradients along a single axis, and thus would not provide notice of voltage gradients that are oriented such that the electrodes reside at substantially the same voltage. This limitation can be overcome to some extent by moving the gradient detector to different orientations; however, such is inconvenient and may be difficult to accomplish while allowing the user to remain out of the water, and is not suitable for the gradient detector intended for passive monitoring. To provide detection of a gradient regardless of its direction without requiring active change in the orientation by the user, multiple pairs of electrodes can be employed, as discussed for the various embodiments described below.

Figure 5:
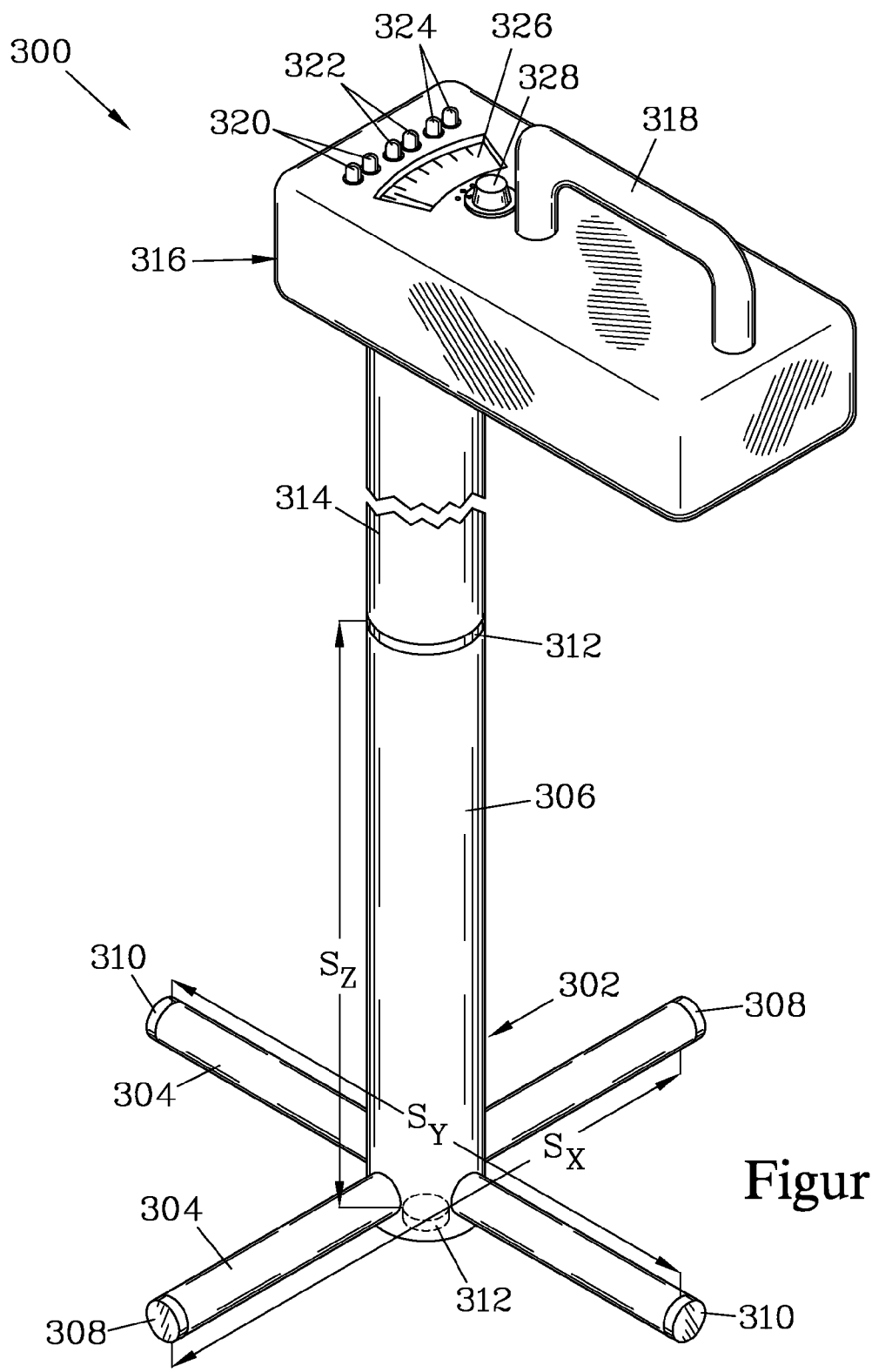
FIG. 5 is an isometric view of a handheld device having three orthogonal pairs of electrodes that reside below the water when in service; however, the device has sufficient buoyancy to reside near the surface and thus aid in the ease of manual movement of the device by a user. Each of the electrodes is connected to an associated pair of LEDs, so that a sufficiently strong voltage gradient in any direction results in a voltage between the electrodes of at least one of the pairs that causes illumination of at least one of the LEDs associated with that pair of electrodes. The gradient detector also has a voltmeter that can be selectively connected between any one of the electrode pairs to allow the user to measure the indicated voltage.

FIG. 5 is an isometric view of a hand-held voltage gradient detector 300 which has the capacity to monitor voltage gradients in three orthogonal directions (X, Y, Z). The gradient detector 300 has a spacer 302 that is configured with a pair of horizontal extensions 304 that extend orthogonally to each other, and a vertical extension 306, which is affixed orthogonally with respect to both the horizontal extensions 304. Affixed to these extensions (304, 306) are three pairs of electrodes (308, 310, and 312), and the spacer 302 can be hollow to house sets of conductors (not shown) between the electrodes (308, 310, and 312) in each pair so as to isolate the conductors from the water when the electrodes (308, 310, and 312) are immersed. The first pair of electrodes 308 are separated along the X-axis by a separation $S_X$, the second pair of electrodes 310 are separated along the Y-axis by a separation $S_Y$, and the third pair of electrodes 312 are separated along the Z-axis by a separation $S_Z$. In most cases, it is preferred for the separations $S_X$, $S_Y$, and $S_Z$ to be equal.

A vertical extender 314 attaches to one of the electrodes 312 and also attaches to a grip section 316 which is provided with a handle 318 to allow a user to readily hold the gradient detector 300 and to position the electrode pairs (308, 310, and 312) at desired locations below the surface of the water. The grip section 316 is also provided with a first pair of LEDs 320, a second pair of LEDs 322, and a third pair of LEDs 324, where each of these pairs of LEDs (320, 322, and 324) is respectively connected between one of the pairs of electrodes (308, 310, and 312) by one of the sets of conductors; this connection can be in a manner analogous to the connection scheme discussed for a single pair of electrodes and LEDs in the above discussion of FIG. 2, or in a manner similar to the circuits discussed below with regard to FIGS. 7-10. Housing the connections between the electrodes and the contacts of the LEDs in the spacer 302 serves to electrically isolate the LEDs and the conductors from the water when the electrode pairs (308, 310, and 312) are immersed. Preferably, the grip section 316 is also sealed to protect these components from damage in the event that the entire gradient detector 300 is inadvertently dropped into the water.

The grip section 316 of this embodiment also houses a voltmeter 326, and a mode switch 328 that can switch the connection of any one of the pairs of electrodes (308, 310, and 312) to the voltmeter 326 rather than to the associated pair of LEDs (320, 322, and 324). Thus, when the presence of a voltage gradient is indicated by illumination of one or more of the LEDs (320, 322, and 324), the user can operate the mode switch 328 to connect the voltmeter 326 to whichever pair of electrodes (308, 310, and 312) corresponds to the brightest LED(s) to obtain a measurement of the voltage between the electrodes (308, 310, and 312). If the separations ($S_X$, $S_Y$, and $S_Z$) are set equal, the voltmeter 326 could be calibrated to indicate the magnitude of the voltage gradient between the electrodes (308, 310, and 312). Again, such measurement has particular benefit when monitoring for voltage gradients liable to cause corrosion damage.

Figure 6:
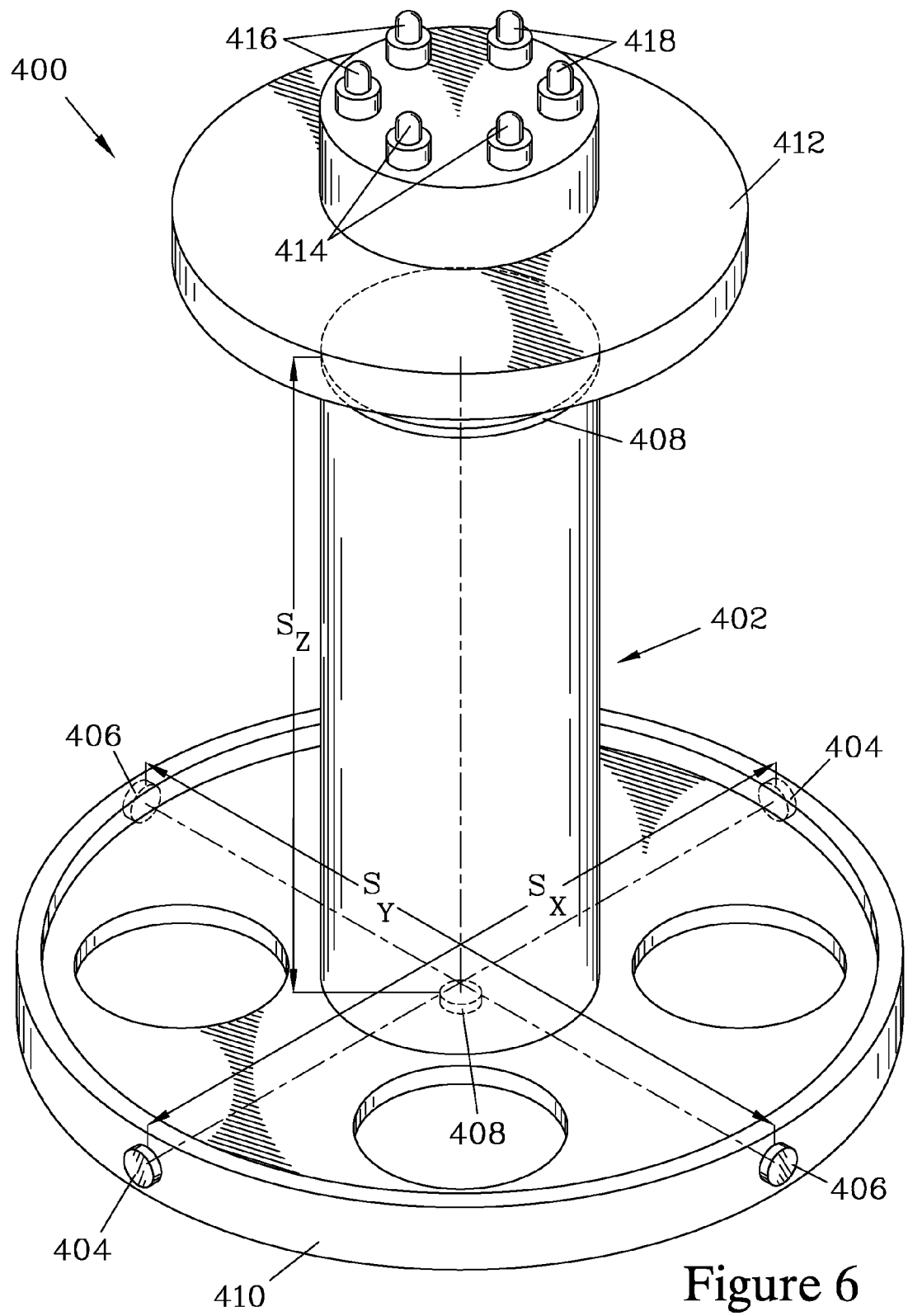
FIG. 6 is an isometric view of another embodiment having three pairs of orthogonal electrodes and associated LED pairs, but in this embodiment these elements are mounted in a spacer that provides a floatable enclosure. Two pairs of electrodes are horizontal and mounted in a ring, while the third pair is mounted normal to the other two pairs and positioned with respect to a flotation collar such that all pairs of electrodes reside below the water when the structure is floated. The contour of the floatable device is configured so as to shroud the electrodes and reduce the likelihood of the electrodes snagging on debris in the water such as seaweed. The location of the flotation collar near the top of the device and incorporating a ballast weight or forming the ring of a relatively dense material to mount the horizontal electrode pairs can provide sufficient ballast to assure the device will not overturn in normal service.

FIG. 6 is an isometric view of a floating voltage gradient detector 400 which shares many features of the voltage gradient detector 300 discussed above. The gradient detector 400 is again designed to monitor the voltage gradient in an X-direction, a Y-direction, and a Z-direction. The gradient detector 400 has a buoyant body 402 that serves as a spacer, and which is hollow in this embodiment. The body 402 has attached thereto a first pair of electrodes 404 which are positioned along the X-axis, a second pair of electrodes 406 which are positioned along the Y-axis, and a third pair of electrodes 408 which are positioned along the Z-axis. The buoyant body 402 is configured with a ring 410 to position the electrodes 404 and 406, which are mounted on the perimeter of the ring 410. The ring 410 provides a convex, rounded structure, so as to reduce the susceptibility of the hollow body 402 to snagging on objects in the water.

In addition to the body 402, the gradient detector 400 has a buoyant cap 412 attached to the body 402 and positioned such that, when the gradient detector 400 is placed in the water, the cap 412 resides, at least in part, above water. Mounted to the cap 412 are a first pair of LEDs 414, a second pair of LEDs 416, and a third pair of LEDs 418; again, these pairs of LEDs (414, 416, and 418) are connected in parallel with reversed polarities between the three pairs of electrodes (404, 406, and 408) in a manner analogous to the connection used for the embodiment shown in FIG. 5, using sets of conductors (not shown) that are housed within the body 402 so as to isolate the electrical connections between the electrodes (404, 406, and 408), the LEDs (414, 416, and 418), and the conductors from the water when the gradient detector 400 is in service. Ballast (not shown) can be added to the body 402 if necessary to assure that all electrodes (404, 406, and 408) reside below the water and that the body 402 does not overturn when the gradient detector 400 is in service; however, the ring 410 may be made of a sufficiently dense material that additional ballast is not needed.

Figure 7:
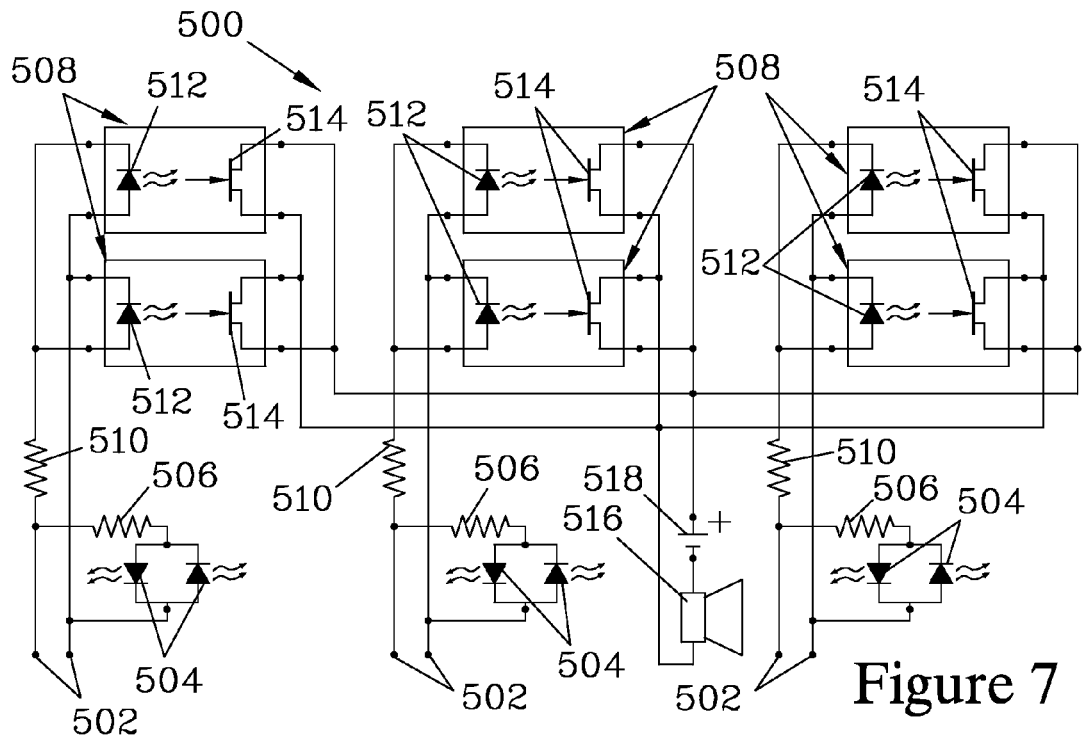
FIG. 7 is a schematic diagram illustrating an embodiment that employs both visible-light LEDs and infrared LEDs to indicate the presence of a voltage between paired electrodes sufficient to cause illumination of at least one of the associated LEDs. Three pairs of electrodes are employed, and the embodiment could be employed in devices such as those shown in FIGS. 5 and 6. The infrared LEDs are incorporated into photoMOS relays that serve as switches to activate an audible alarm, while the visible LEDs provide a visual indication when a voltage gradient is present. The schematic view also illustrates resistors that are connected in series with the LEDs in order to limit the current and reduce the likelihood of damage in service.

FIG. 7 is a schematic diagram illustrating one example of the circuitry that could be employed for a 3-directional gradient detector 500 that is similar to those embodiments shown in FIGS. 5 and 6. The gradient detector 500 shown in FIG. 7 is designed to provide not only a visual indication of the presence of a sufficiently large voltage gradient, but also an audible alarm to alert the user that such a gradient is present, thereby providing a greater degree of safety and making the device suitable for passively monitoring a region of water.

The gradient detector 500 again has three pairs of electrodes 502 that are separated along orthogonal axes, with the spacing between electrodes 502 being the same for each pair. For each pair of electrodes 502, a pair of reversed-polarity visible LEDs 504 are connected, in series with a visible LED resistor 506. The visible LEDs 504 provide a visual indication of when a voltage gradient in the water is sufficiently strong and is positioned so as to cause the voltage between at least one of the pairs of electrodes to be at least as great as the threshold activation voltage for the associated visible LEDs 504; the threshold activation voltage is selected to include the voltage drop across the visible LED resistor 506 at the minimum voltage that causes one of the LEDs 504 to illuminate.

Connected in parallel with each of the pairs of visible LEDs 504 is a pair of photoMOS relays 508, which are connected in parallel to each other with reversed polarity, and in series with a photoMOS resistor 510. Each of the photoMOS relays 508 consists of an infrared LED 512 and a photosensor 514, where the infrared LED 512 responds to voltage across the electrodes 502 in the same manner as one of the visible LEDs 504, and the photosensor 514 acts as a switch that closes when the light generated by the infrared LED 512 is detected. All the photosensors 514 are connected to an audible alarm device, in this embodiment a piezo sounder 516, and a battery 518. When any of the infrared LEDs 512 experiences a voltage sufficient to illuminate it, the corresponding photosensor 514 acts as a closed switch to allow the battery 518 to power the piezo sounder 516 to provide an audible notice of the presence of a voltage gradient. When no gradient is present, the photosensors 514 act as open switches with only a very small leakage current, allowing the battery 518 to have a desirably long useful life when the gradient detector 500 is operating. For example, for six photoMOS relays, each having a 1 μA leakage current when switched "off", a 3V battery can be employed to power the piezo sounder, resulting in a power consumption of only 18 μW when monitoring.

Because the activation voltage for the visible LEDs 504 is typically slightly higher than the activation voltage for the infrared LEDs 512, the values of the visible LED resistors 506 and the photoMOS resistors 510 may be adjusted so that both the visible LEDs 504 and the photoMOS relays 508 are activated by the same voltage potential between the electrode pair 502 to which they are connected. For example, LEDs emitting visible red light can have an activation voltage as low as about 1.6V, corresponding to an LED current of about 1 mA, while a photoMOS relay can have an activation voltage as low as about 1.14V, corresponding to an IR-LED current of about 1.8 mA. However, to preserve the sensitivity of the detector 500, it is typically preferred to allow the photoMOS relays 508 to activate at a lower activation voltage, and to select the resistors (506, 510) to provide a desired balance between having a low voltage drop across the resistor (506, 510) when the corresponding LED (504, 512) is first activated, and having the resistor (506, 510) sufficiently large as to protect the LED (504, 512) from damage due to excessive currents under the expected operating conditions.

For example, for a visible red LED having an activation voltage of 1.6V and a corresponding current of 1 mA, the associated resistor could be selected to have a value that results in a 0.05V voltage drop at that current, in which case Ohm's law finds the desired resister value to be 50Ω. If the LED has a maximum recommended operating current of 20 mA, the 50Ω resistor will have a voltage drop of 1V at that current. Thus, this combination of the LED and resistor will detect the presence of a voltage gradient that results in a voltage between the electrodes of over 1.65V, and can be safely operated when the voltage is as high as 2.6V.

For the example of an IR-LED typical of those employed in photoMOS relays, having an activation voltage of 1.14V and 1.8 mA current, a resistor of 28Ω would provide a voltage drop of 0.05V at the minimum 1.8 mA current. When the IR-LED has a maximum recommended operating current of 50 mA, a 28Ω resistor results in a voltage drop of 1.4V, and thus the relay will switch on when the voltage across the electrodes is above 1.19V, and can be safely operated up to a voltage of 2.5V. Protection from higher voltages can be provided by a voltage-limiting device, such as discussed below with regard to FIG. 8. Whether or not such additional protection is included, it may be desirable to provide a testing device that can engage one of the pairs of the electrodes to apply a specified voltage across the pair in order to periodically verify that LEDs are operating as intended. Such a testing device could include probes that can be spaced at the separation S in order to be placed against a selected pair of electrodes, and could employ a 3-position switch to allow the user to selectively apply a DC voltage in either polarity or an AC voltage. This testing device could be sequentially engaged with each pair of electrodes to check the operating condition of all the LEDs. When both visible LEDs and photoMOS relays are employed, such a testing device could also allow the user to switch between two prescribed voltages, one just sufficient to activate the photoMOS relays and a slightly higher voltage sufficient to illuminate the visible LEDs.

When determining the desired separation between the electrodes, the voltage drop across the resistor at the minimum operating current of the LED can be simply added to the activation voltage of the LED to provide an effective activation threshold voltage that is sufficiently accurate for this application. In such cases, the separation can be determined as:

$$S_{MIN} = \frac{V_{LED} + (I_{LED} * R)}{G_{MIN}} = \frac{V_{LED} + V_{RESISTOR}}{G_{MIN}}$$

where $V_{LED}$ is the minimum activation voltage for the LED, $I_{LED}$ is the current through the LED at the minimum activation voltage, $V_{RESISTOR}$ is the voltage drop across the resistor resulting from the current at that LED voltage, and $G_{MIN}$ is the minimum voltage gradient to be detected. In the case where the minimum voltage gradient to be detected is 2V/foot, the visible red LED and resistor values provided above result in a minimum separation between the electrodes of 0.8 feet, while the values for the IR-LED and associated resistor discussed above result in a minimum separation of only 0.6 feet. These relatively small values allow the gradient detector to be conveniently sized.

When a combination of visible LEDs 504 and photoMOS relays 508 are employed, the photoMOS relays 508 can typically respond in a more sensitive manner to voltage gradients for a particular separation of the electrodes 502, and can provide an indication such as a high-intensity light (not shown) and/or audible alarm (piezo sounder 516) that is more readily noticed by a user. In such cases, the visible LEDs 504 are still beneficial in providing an indication of the direction of the gradient, and may also make it easier for the user to determine whether the gradient is caused by an AC or DC voltage. Alternatively, an indication of DC versus AC voltage could be provided by connecting one of each pair of photoMOS relays to one alarm device and the other of each pair to a different device.

Figure 8:
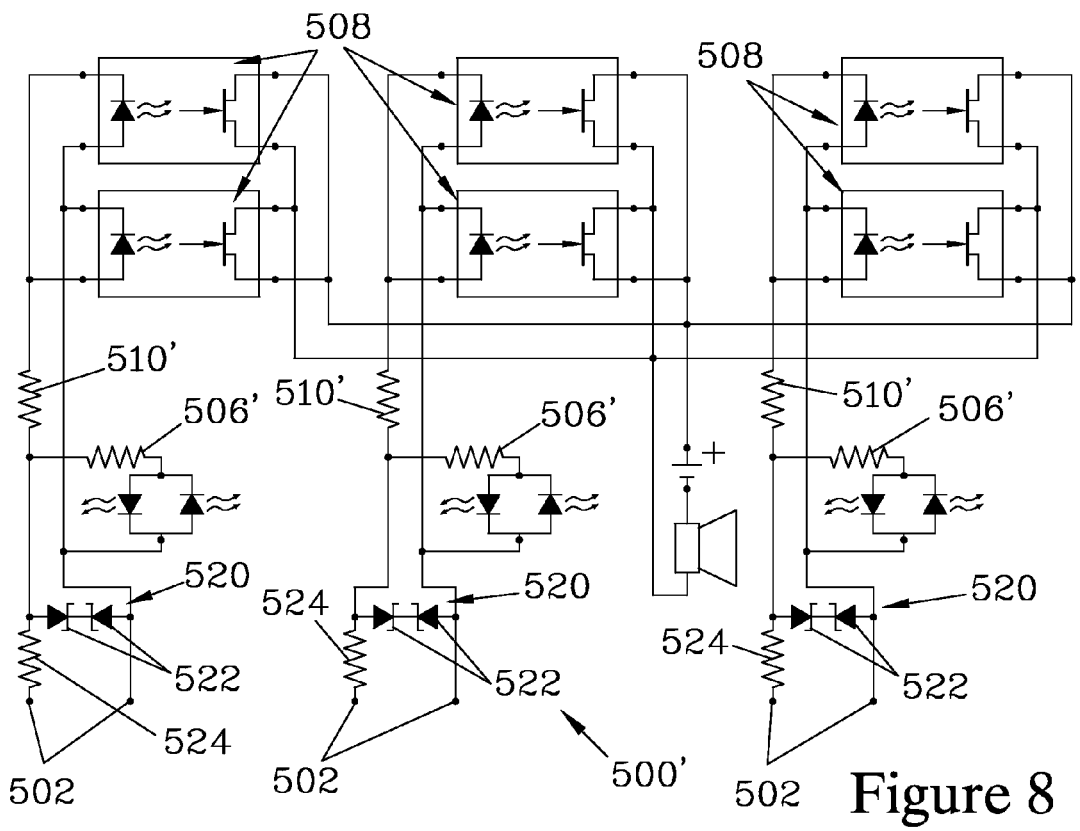
FIG. 8 is a schematic diagram illustrating an embodiment similar to that shown in FIG. 7, but where each pair of electrodes has an associated pair of Zener diodes connected in parallel with the remaining circuitry, along with an associated resister to provide a voltage limiting circuit. These Zener diode voltage limiting circuits serve to set an upper limit on the voltage experienced by the remaining circuitry so as to prevent damage from excessively high voltages across the electrodes.

FIG. 8 is schematic diagram of another embodiment, of the present invention, a gradient detector 500' that is similar to the gradient detector 500 discussed above, but where each of the electrode pairs 502 has a voltage limiting circuit 520, which consists of a pair of Zener diodes 522 connected in parallel with the visible LEDs 504 and the photoMOS relays 508, and a Zener resistor 524 connected in series. In this case, the visible LED resistors 506' and the photoMOS resistors 510' should have values selected to take into account the added resistance of the Zener resistors 524.

Figure 9:
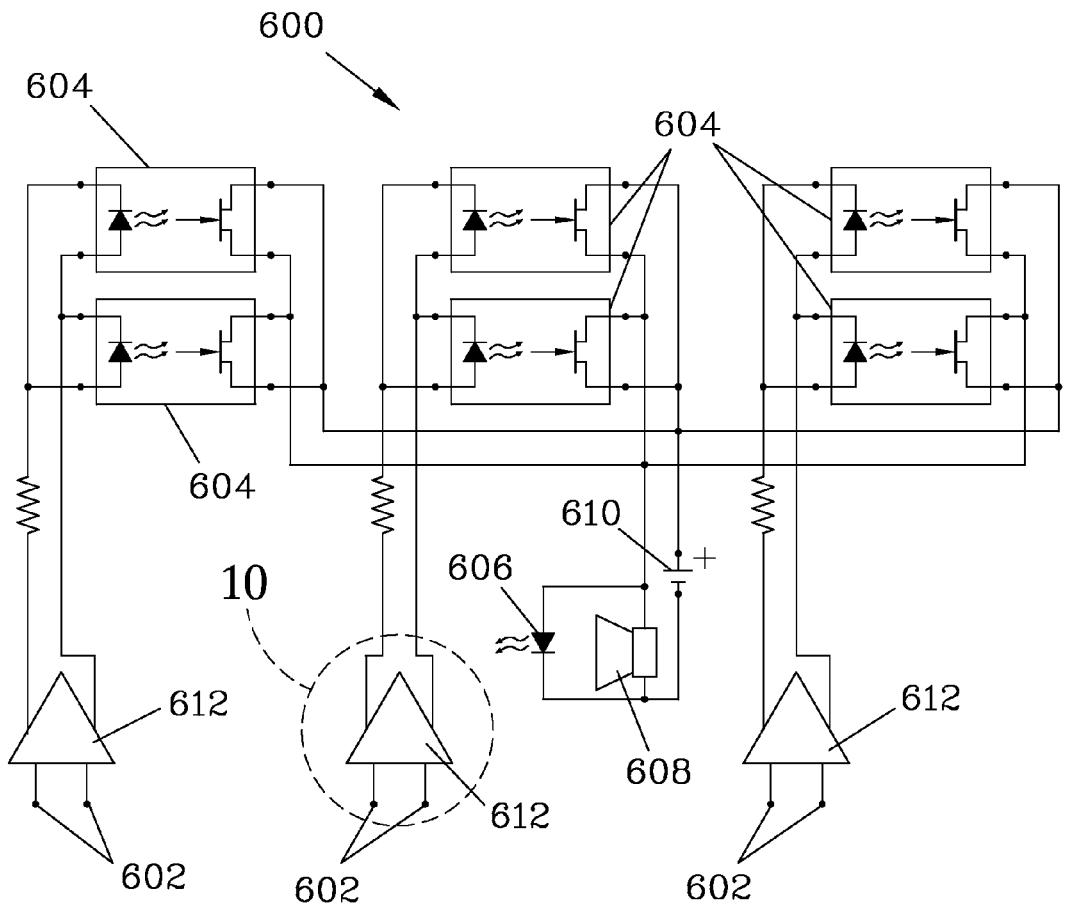
FIG. 9 is a schematic diagram illustrating another embodiment that employs LED-based photoMOS relays, but where no paired visible-light LEDs are employed. Visual indication of the presence of a sufficiently strong voltage gradient is provided by a warning light that is switched on by the photoMOS relays; one suitable warning light is a high-intensity LED lamp. The photoMOS relays also switch an audible alarm. This embodiment also employs amplifiers to increase the potential between the electrode pairs to allow detection of voltage gradients that would otherwise be too small to activate the photoMOS relays. This sensitivity to low voltages makes the device well suited to detecting voltage gradients associated with increased risk of corrosion.

FIG. 9 is a schematic diagram illustrating another embodiment of the present invention, a gradient detector 600 that again employs three pairs of electrodes 602 and associated photoMOS relays 604 that serve as switches to activate a high-intensity LED 606 that serves as a warning light, and a piezo sounder 608, both powered by a battery 610. While the gradient detector 600 illustrated does not include visible LEDs, such could be readily provided, connected in the same manner as those shown in FIGS. 7 and 8. Similarly, an alternative alarm device could be employed; one example would be a wireless transmitter that communicates an alarm notice to a remote receiver. Another alternative would be a pair of different alarm devices, such as differently-colored high-intensity LED lamps or piezo sounders set to different frequencies, to help the user identify whether a DC voltage or AC voltage is responsible for the voltage gradient.

The gradient detector 600 is designed for use to detect gradients that are lower than those associated with risk of injury to individuals in the water, but rather those which are likely to cause damage due to corrosion at an unacceptable rate. Such gradients may be in the neighborhood of about 0.01 V/foot-1.0 V/foot. For each pair of electrodes 602, a voltage amplifier 612 is provided, which is powered batteries and connections that are not illustrated. The output of the voltage amplifier 612 is provided to the photoMOS relays 604 associated with that pair of electrodes 602. Typically, a gain of about 5× to 500× is felt to be effective. Because the voltage amplifiers 612 require power when in operation, the life of batteries powering these amplifiers is much shorter than the life of the battery used in the gradient detectors (500, 500') shown in FIGS. 7 and 8. For those detectors that are designed to float or be affixed to a structure such that the electrodes are submerged, a photovoltaic solar panel can be employed to recharge the batteries that power the amplifiers 612 to greatly reduce the need to service the detector.

In some cases, it may be desirable for the voltage amplifiers 612 to have a variable gain to allow the user to set the sensitivity of the gradient detector 600 for a desired application. For example, the user might first use the gradient detector 600 with the amplifiers 612 set to a relatively low gain to test the water in several desired locations for strong gradients (in the neighborhood of 0.1V/ft to 1.0 V/ft) caused by voltage leakage from one vessel to another and/or between a vessel and a docking structure; such gradients are typically associated with electrolytic corrosion. If no such gradient is detected, the user could then set the gain to a higher value to use the gradient detector 600 to test the water alongside a vessel for smaller gradients, in the neighborhood of 0.01V/ft to 0.1V/ft, typically associated galvanic corrosion action between dissimilar metals in the water.

Figure 10:
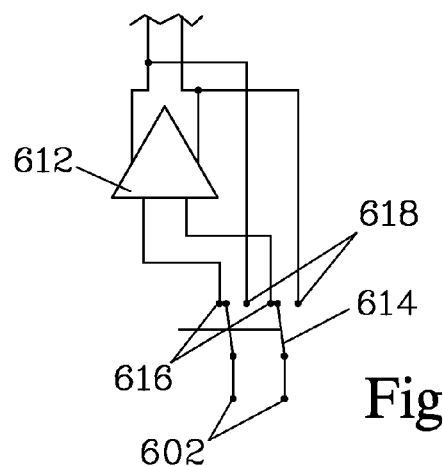
FIG. 10 is a partial view of an optional modification of the embodiment shown in FIG. 9, corresponding to the region 10. In the modified gradient detector, each pair of electrodes is connected to its associated amplifier via a switch that allows the electrodes to be connected either to the input of the amplifier or directly to the photoMOS relays, allowing the user to select whether the photoMOS relays respond to the output of the amplifier or to the unamplified voltage.

FIG. 10 is a partial view illustrating an optional modification to the connection between one of the pairs of electrodes 602 and the associated amplifier 612 that could be employed in the gradient detector 600. As shown in FIG. 10, a double-pole double-throw switch 614 is provided, which selectively connects the electrodes 602 either to a first pair of switch contacts 616, that are in turn connected to the input of the amplifier 612, or to a second pair of switch contacts 618, which are connected directly to the photoMOS relays 604 (shown in FIG. 9) so as to provide the voltage between the electrodes 602 to the photoMOS relays 604 without amplification.

Figure 11:
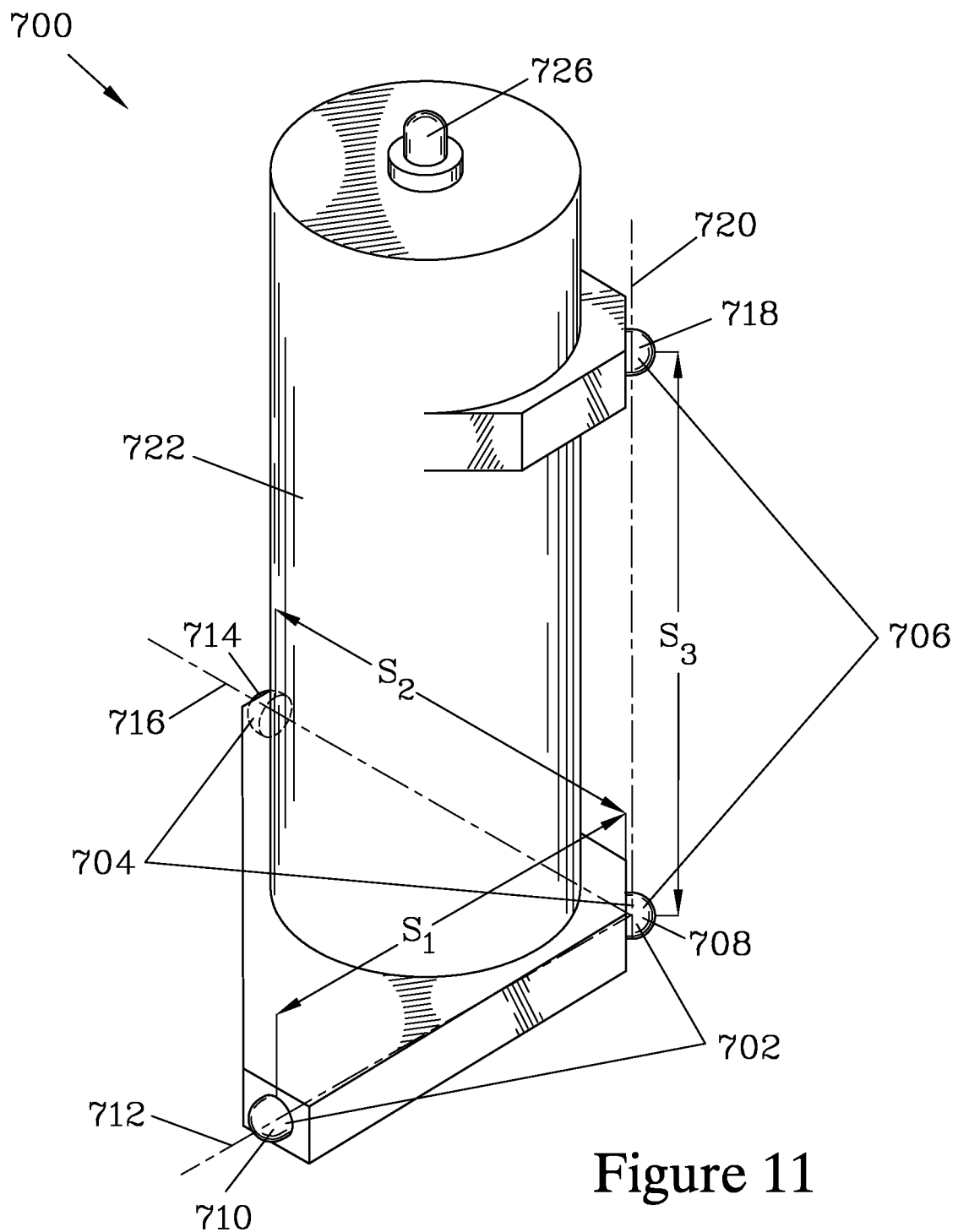
FIG. 11 is an isometric view that illustrates a voltage gradient detector that forms another embodiment of the present invention. The voltage gradient detector again has three pairs of electrodes separated along orthogonal axes, but in this embodiment the three pairs share a common electrode. This embodiment also differs in that the separations between the electrodes are not uniform for the three pairs.

FIG. 11 illustrates a voltage gradient detector 700 that again has a first pair of electrodes 702, a second pair of electrodes 704, and a third pair of electrodes 706. In the detector 700, the three pairs of electrodes (702, 704, and 706) share a common electrode 708. A first discrete electrode 710 is separated from the common electrode 708 along a first axis 712 by a separation $S_1$, a second discrete electrode 714 is separated from the common electrode 708 along a second axis 716 by a separation $S_2$, and third discrete electrode 718 is separated from the common electrode 708 along a third axis 720 by a separation $S_3$, where the three axes (712, 716, and 720) are orthogonal to each other.

Figure 12:
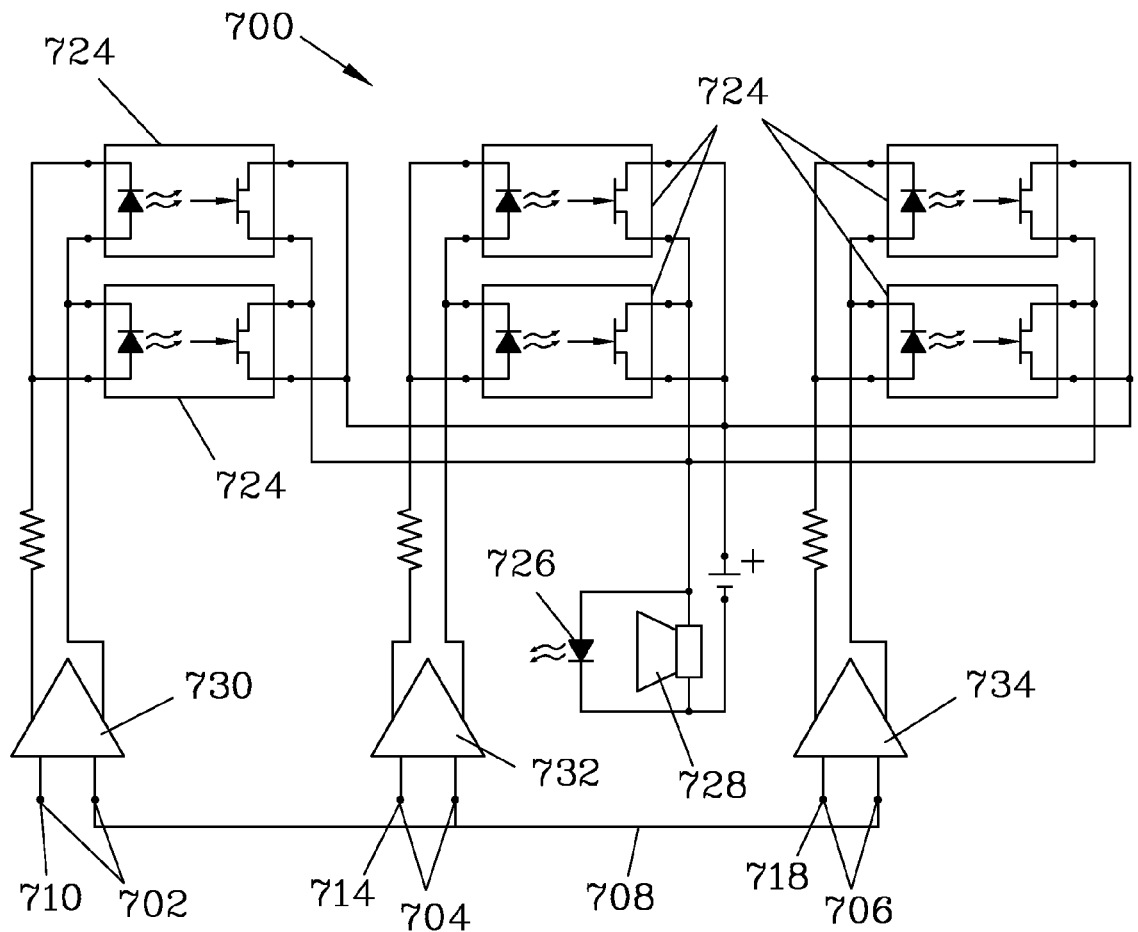
FIG. 12 is a schematic diagram illustrating one example of circuitry that can be employed in an embodiment such as that shown in FIG. 11, having a common electrode shared by three pairs of electrodes. The circuit is similar to that shown in FIG. 9, but each pair of electrodes has one discrete electrode and one electrode that is connected to an electrode of each of the other pairs. When the separations between the electrode pairs differ, compensation for such difference could be provided by differing the gain of the amplifiers to provide a more isotropic response of the detector.

As shown in FIG. 11, the electrodes (708, 710, 714, and 718) are affixed to a spacer 722 that provides a housing to maintain the electrodes (708, 710, 714, and 718) spaced apart along their respective axes (712, 716, and 720) and to house the circuitry connected to the electrodes (708, 710, 714, and 718); one example of circuitry that would be suitable is shown in FIG. 12. When at least one pair of electrodes (702, 704, or 706) is exposed to a gradient of sufficient magnitude, the circuitry energizes a photoMOS relay 724 (shown in FIG. 12) to illuminate a high-intensity visible LED 726 mounted on the spacer 722. Alternative warnings, such as an audible alarm 728 (also shown in FIG. 12) or a signal transmitted to a remote device could also be employed, either in place of or in addition to the visible LED 726.

The example of circuitry shown in FIG. 12 shares many features in common with the circuitry shown in FIG. 9 for the detector 600 discussed above. The detector 700 differs in that each of the electrode pairs (702, 704, and 706) shares the common electrode 708. Thus, a first amplifier 730 receives the voltage between the first electrode 710 and the common electrode 708, a second amplifier 732 receives the voltage between the second electrode 714 and the common electrode 708, and a third amplifier 734 receives the voltage between the third electrode 718 and the common electrode 708. The output of each of the amplifiers (730, 732, and 734) is provided to one pair of the photoMOS relays 724 that serve as switches to activate the high-intensity LED 726.

As shown in FIG. 11, the position of the electrodes (708, 710, 714, and 718) on the spacer 722 is such that the separation $S_3$ is substantially larger than the separations $S_1$ and $S_2$. If the amplifiers (730, 732, and 734) have equal gains, this will result in a greater sensitivity to gradients along the third axis 720 than along the other axes (712 and 716). To provide a more isotropic response, the gain of the third amplifier 734 can be made proportionally less than that of the first and second amplifiers (730 and 732) to compensate for the increased separation and provide a similar response along each axis (712, 716, and 720) to a gradient of equal magnitude. It should be appreciated that, if the separations were similar and sufficiently large, no amplification may be required and a circuit similar to those shown in FIGS. 7 and 8 could be employed, but where one electrode of each pair is provided by an electrode that is connected to serve as one of the electrodes for each pair.

Figure 13:
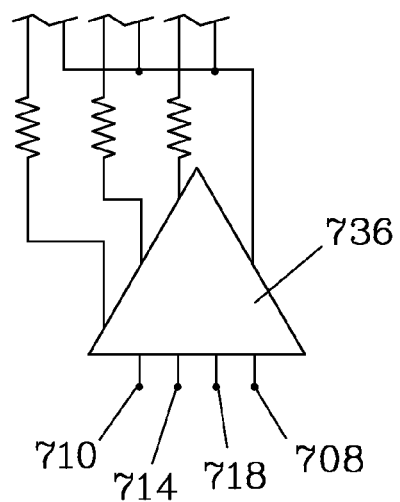
FIG. 13 is a partial schematic view of a modification to the circuit shown in FIG. 12, where the three amplifiers for the electrode pairs are provided by a single multiple-amplifier device. The use of a single device simplifies the connections needed to power the amplifiers, as only one set of power connections is needed, rather than three as when separate amplifiers are employed.

FIG. 13 illustrates a portion of an alternate circuit for the detector 700, where a multiple-amplifier 736 is employed to replace the individual amplifiers (730, 732, and 734) to reduce the number of connections needed to provide power to the amplifiers. Such multiple amplifiers are commonly available as integrated circuits, such as a quad-amp IC, of which only three of the four amplifier inputs and outputs are employed. The use of the single multiple amplifier 736 requires that the electrode pairs (702, 704, and 706) share the common electrode 708.

FIG. 14 illustrates a voltage gradient detector 800 that forms another embodiment of the present invention, and which again employs three pairs of electrodes 802 that each consist of a shared common electrode 804 and a discrete electrode 806. The pairs of electrodes 802 are separated along axes 808 (shown in FIG. 15) that are again orthogonal to each other. The detector 800 differs from the multiple-pair embodiments discussed above in that the axes 808 are not aligned with the horizontal plane or the vertical axis when in service, but rather are inclined thereto. As better illustrated in FIG. 15, the electrodes (804, 806) are positioned at four adjacent corners of a cube, with the axes 808 defining edges of the cube.

The detector 800 is designed for use while submerged, and has a sealed housing 810 that serves as a spacer and which contains the circuitry needed to provide a warning of the presence of a voltage gradient of sufficient magnitude to be of concern. The circuitry can be similar to that shown in FIG. 12; however, since the detector 800 is intended for service while submerged, it is preferred to employ an ultrasonic transmitter 812 that generates a signal suitable for reception by a remote receiver 814 to provide the warning. The remote receiver 814, with a submerged ultrasonic sensor 816, can provide a visual and/or audible alarm to notify persons in the area that a gradient of concern is present in the water. The detector 800 can be secured to an anchor or underwater structure, such as a dock pile, or could be attached to a submerged device, such as a pool cleaning vacuum, that operates underwater.

Because the pairs of electrodes 802 are separated along orthogonal axes 808 and have the same distance of separation ($S_1$, $S_2$, and $S_3$) between the two electrodes (804 and 806) that form the pair, they provide a relatively isotropic response to gradients throughout the volume of water surrounding the detector 800. The response will be strongest for a gradient that is along one of the axes 808, and weakest for a gradient that is inclined to all three axes 808. In this latter case, the weakest signal for a gradient of a particular strength will still be 58% ($1/\sqrt{3}$) of the magnitude of a signal for the same strength of gradient directed along one of the axes 808. In the event that an even more isotropic response is desired, such could be achieved by employing additional pairs of electrodes separated along axes that are inclined with respect to the axes 808.

Figure 16:
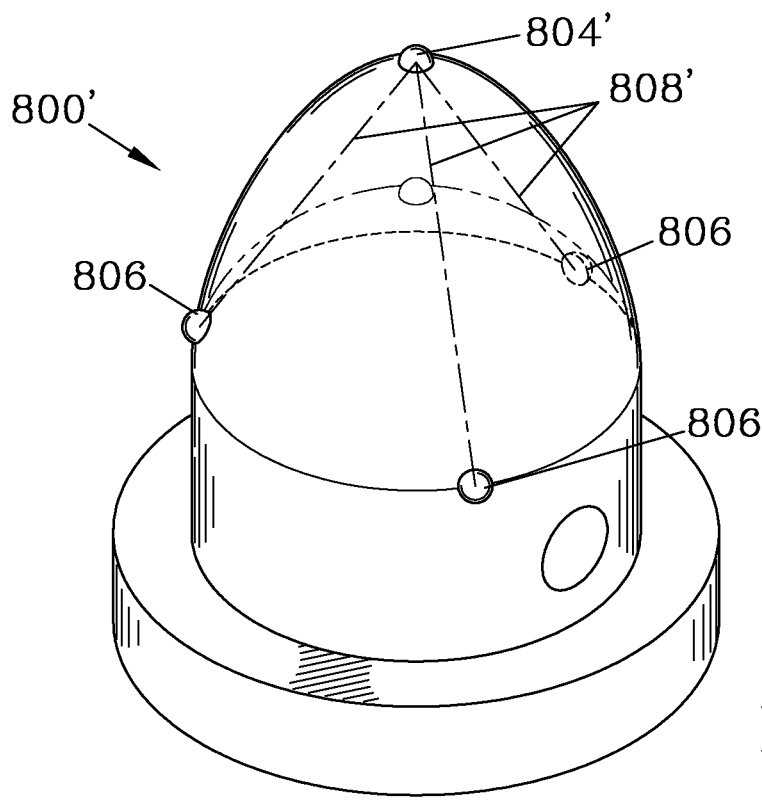
FIG. 16 illustrates a modification of the voltage gradient detector shown in FIG. 14, where the position of the common electrode has been elevated with respect to the discrete electrodes of the pairs. This modification results in angles between the axes that are less than 90°.
Figure 17:
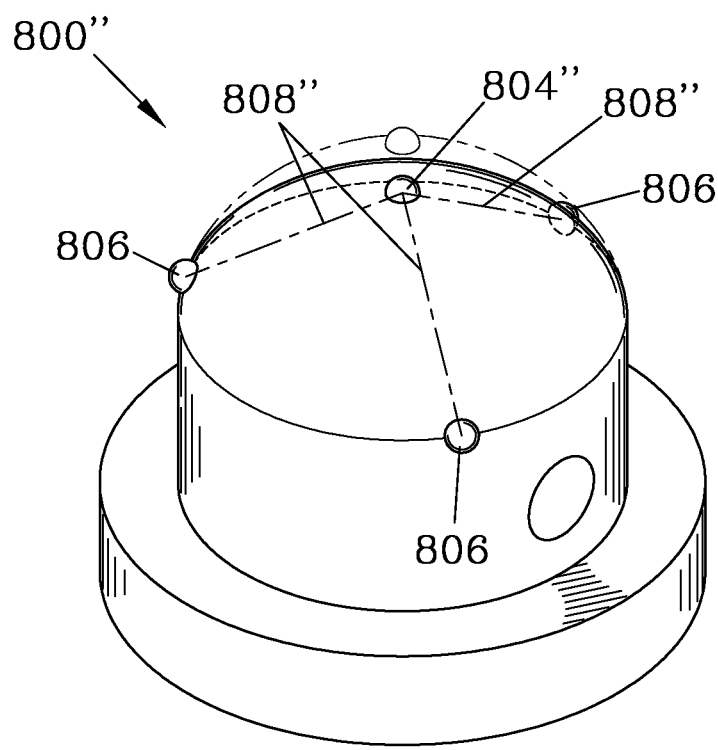
FIG. 17 illustrates another modification of the voltage gradient detector shown in FIG. 14, where the position of the common electrode has been moved closer to the plane in which the discrete electrodes reside. This modification results in angles between the axes that are greater than 90°.

The directional effect of the positioning of the electrodes can be illustrated by the modified embodiments shown in FIGS. 16 and 17, which respectively show detectors 800' and 800", where the vertical position of the common electrodes (804', 804") has been adjusted such that the axes (808', 808") are no longer orthogonal to each other. In the detector 800', the common electrode 804' has been elevated relative to the discrete electrodes 806, with the result that the angles between the axes 808' are somewhat less than 90°. This results in a response pattern that provides a stronger signal for a voltage gradient that is vertical than for a gradient of the same strength that is horizontal. In the detector 800", the common electrode 804" has been moved vertically to a location closer to the common plane of the discrete electrodes 806, resulting in angles between the axes 808" that are somewhat greater than 90°. This configuration results in a response pattern that provides a weaker signal for a voltage gradient that is vertical than for a similar gradient that is horizontal. When a common electrode is employed, the axes of separation will intersect. When discrete pairs of electrodes are employed, the axes of separation may be skewed rather than intersecting; in such cases, the inclination of one axis with respect to another is determined by the inclination of vectors that are each parallel to one axis and which intersect each other.

The directionality of the response increases as the angles diverge further from 90°, and when the angles approach 45° or 135°, the directionality is so great as to provide little or no benefit from employing three electrode pairs rather than only one or two. In the case of the detector 800', the response would become similar to that of a single-pair device with the electrodes separated vertically, while in the detector 800", the response would become similar to that of a dual-pair device with the pairs separated along orthogonal, horizontal axes. For most purposes, it is felt that maintaining the angles between the axes between about 80° and 100° provides a degree of isotropic response close of that of a device employing orthogonal axes.

While the novel features of the present invention have been described in terms of particular embodiments and preferred applications, it should be appreciated by one skilled in the art that substitution of materials and modification of details can be made without departing from the spirit of the invention.

What I claim is:

1. A voltage gradient detector for use in water to detect the presence of a voltage gradient at least as large as a specified critical voltage gradient $G_{MIN}$, the gradient detector comprising:
   a first pair of electrodes maintained at a separation $S_1$ along a first axis;
   at least one first LED with a known voltage characteristic such that said first LED is illuminated when it experiences a set voltage threshold value $V_{T1}$;
   means for electrically connecting said at least one first LED to said first pair of electrodes in series with a first LED resistor such that said at least one first LED experiences a voltage that is directly responsive to the voltage between said first pair of electrodes and which is at least as great as the set voltage threshold value $V_{T1}$ when said first pair of electrodes, spaced apart at the separation $S_1$, are in contact with a voltage gradient at least as great as the critical voltage gradient $G_{MIN}$,
   wherein the set voltage threshold value $V_{T1}$ is calculated by adding the minimum voltage that illuminates said at least one first LED and the voltage drop across said first LED resistor that results from the current through said at least one first LED at that minimum voltage;
   a second pair of electrodes maintained at a separation $S_2$ along a second axis that is substantially orthogonal to the first axis;
   at least one second LED with a known voltage characteristic such that said second LED is illuminated when it experiences a set voltage threshold value $V_{T2}$;
   means for electrically connecting said at least one second LED to said second pair of electrodes in series with a second LED resistor such that said at least one second LED experiences a voltage that is directly responsive to the voltage between said second pair of electrodes and which is at least as great as the set voltage threshold value $V_{T2}$ when said second pair of electrodes, spaced apart at the separation $S_2$, are in contact with a voltage gradient at least as great as the critical voltage gradient $G_{MIN}$,
   wherein the set voltage threshold value $V_{T2}$ is calculated by adding the minimum voltage that illuminates said at least one second LED and the voltage drop across said second LED resister that results from the current through said at least one second LED at that minimum voltage;

a third pair of electrodes maintained at a separation $S_3$ along a third axis that is substantially orthogonal to the first axis and to the second axis;

at least one third LED with a known voltage characteristic such that said third LED is illuminated when it experiences a set voltage threshold value $V_{T3}$;

means for electrically connecting said at least one third LED to said third pair of electrodes in series with a third LED resistor such that said at least one third LED experiences a voltage that is directly responsive to the voltage between said third pair of electrodes and which is at least as great as the set voltage threshold value $V_{T3}$ when said third pair of electrodes, spaced apart at the separation $S_3$, are in contact with a voltage gradient at least as great as the critical voltage gradient $G_{MIN}$, wherein the set voltage threshold value $V_{T3}$ is calculated by adding the minimum voltage that illuminates said at least one third LED and the voltage drop across said third LED resister that results from the current through said at least one third LED at that minimum voltage; and means for providing a notice when said at least one of said LEDs is illuminated.

2. The voltage gradient detector of claim 1 wherein the substantially orthogonal relationship between the axes is further restricted such that each is inclined with respect to each of the other two by an angle between 80° and 100°.

3. The voltage gradient detector of claim 2 wherein each of said first, second, and third pairs of electrodes has a discrete electrode and a common electrode, and wherein said common electrode is connected to each of, said means for electrically connecting said at least one first LED, said means for electrically connecting said at least one second LED, and said means for electrically connecting said at least one third LED.

4. The voltage gradient detector of claim 2 wherein the separations $S_1$, $S_2$, and $S_3$ are the same length.

5. The voltage gradient detector of claim 4 wherein the voltage threshold values $V_{T1}$, $V_{T2}$, and $V_{T3}$ of said first, second, and third LEDs are the same.

6. The voltage gradient detector of claim 5 wherein each of said first, second, and third LEDs is part of a photoMOS relay; and further wherein said means for providing a notice comprises:

an alarm device activated by at least one of said photoMOS relays, said alarm device being selected from the group of:
devices that generate an audible alarm;
devices that emit a high-intensity light;
devices that transmit an ultrasonic signal for reception by a remote receiver; and
devices that transmit an electromagnetic signal for reception by a remote receiver.

7. The voltage gradient detector of claim 6 wherein said alarm device transmits an ultrasonic signal for reception by a remote receiver, and further wherein said means for electrically connecting said at least one first, second, and third LEDs are sealably housed in a spacer so as to make the detector suitable for use while submerged.

8. The voltage gradient detector of claim 2 wherein said at least one first LED is connected across said first pair of electrodes and the separation $S_1$ is selected such that:

$$S_1 > V_{T1}/G_{MIN},$$

whereby said at least one first LED is illuminated when said first pair of electrodes are exposed to a voltage potential therebetween that is at least as great as the threshold value $V_{T1}$, thereby providing a voltage sufficient to illuminate said at least one first LED;

further wherein said at least one second LED is connected across said second pair of electrodes and the separation $S_2$ is selected such that:

$$S_2 > V_{T2}/G_{MIN},$$

whereby said at least one second LED is illuminated when said second pair of electrodes are exposed to a voltage potential therebetween that is at least as great as the threshold value $V_{T2}$, thereby providing a voltage sufficient to illuminate said at least one second LED; and yet further wherein said at least one third LED is connected across said third pair of electrodes and the separation $S_3$ is selected such that:

$$S_3 > V_{T3}/G_{MIN},$$

whereby said at least one third LED is illuminated when said third pair of electrodes are exposed to a voltage potential therebetween that is at least as great as the threshold value $V_{T3}$, thereby providing a voltage sufficient to illuminate said at least one third LED.

9. The voltage gradient detector of claim 2 wherein said means for electrically connecting said at least one first LED to said first pair of electrodes further comprises a first amplifier having a gain $A_1$, an input connected between said first pair of electrodes, and an output that provides a voltage to power said at least one first LED, where the output voltage equals the product of the input voltage and the gain $A_1$, the separation $S_1$ being selected such that: $S_1 * A_1 > V_{T1}/G_{MIN}$;

further wherein said means for electrically connecting said at least one second LED to said second pair of electrodes further comprises a second amplifier having a gain $A_2$, an input connected between said second pair of electrodes, and an output that provides a voltage to power said at least one second LED, where the output voltage equals the product of the input voltage and the gain $A_2$, the separation $S_2$ being selected such that: $S_2 * A_2 > V_{T2}/G_{MIN}$, and yet further wherein said means for electrically connecting said at least one third LED to said third pair of electrodes further comprises a third amplifier having a gain $A_3$, an input connected between said third pair of electrodes, and an output that provides a voltage to power said at least one third LED, where the output voltage equals the product of the input voltage and the gain $A_3$, the separation $S_3$ being selected such that: $S_3 * A_3 > V_{T3}/G_{MIN}$.

10. The voltage gradient detector of claim 9 wherein the separations $S_1$, $S_2$, and $S_3$ are the same length, the voltage threshold values $V_{T1}$, $V_{T2}$, and $V_{T3}$ are the same, and the amplifier gains $A_1$, $A_2$, and $A_3$ are the same.

11. The voltage gradient detector of claim 9 wherein each of said first, second, and third pairs of electrodes has a discrete electrode and a common electrode, and wherein said common electrode is connected to each of said inputs of said first, second, and third amplifiers.

12. The voltage gradient detector of claim 11 wherein said first, second, and third amplifiers are provided by a single multiple-amplifier device.

13. A voltage gradient detector for use in water to detect the presence of a voltage gradient at least as large as a specified critical voltage gradient $G_{MIN}$, the gradient detector comprising:

a first pair of electrodes maintained at a separation $S_1$ along a first axis;

at least one first LED with a known voltage characteristic such that said first LED is illuminated when it experiences a set voltage threshold value $V_{T1}$;

means for electrically connecting said at least one first LED to said first pair of electrodes in series with a first LED resistor such that said at least one first LED experiences a voltage that is directly responsive to the voltage between said first pair of electrodes and which is at least as great as the set voltage threshold value $V_{T1}$ when said first pair of electrodes, spaced apart at the separation $S_1$, are in contact with a voltage gradient at least as great as the critical voltage gradient $G_{MIN}$, wherein the set voltage threshold value $V_{T1}$ is calculated by adding the minimum voltage that illuminates said at least one first LED and the voltage drop across said first LED resister that results from the current through said at least one first LED at that minimum voltage;

a second pair of electrodes maintained at a separation $S_2$ along a second axis that is inclined to the first axis by an angle of between 45° and 135°;

at least one second LED with a known voltage characteristic such that said second LED is illuminated when it experiences a set voltage threshold value $V_{T2}$;

means for electrically connecting said at least one second LED to said second pair of electrodes in series with a second LED resistor such that said at least one second LED experiences a voltage that is directly responsive to the voltage between said second pair of electrodes and which is at least as great as the set voltage threshold value $V_{T2}$ when said second pair of electrodes, spaced apart at the separation $S_2$, are in contact with a voltage gradient at least as great as the critical voltage gradient $G_{MIN}$, wherein the set voltage threshold value $V_{T2}$ is calculated by adding the minimum voltage that illuminates said at least one second LED and the voltage drop across said second LED resister that results from the current through said at least one second LED at that minimum voltage;

a third pair of electrodes maintained at a separation $S_3$ along a third axis that is inclined to the first axis by an angle of between 45° and 135°, and is inclined to the second axis by an angle of between 45° and 135°;

at least one third LED with a known voltage characteristic such that said third LED is illuminated when it experiences a set voltage threshold value $V_{T3}$;

means for electrically connecting said at least one third LED to said third pair of electrodes in series with a third LED resistor such that said at least one third LED experiences a voltage that is directly responsive to the voltage between said third pair of electrodes and which is at least as great as the set voltage threshold value $V_{T3}$ when said third pair of electrodes, spaced apart at the separation $S_3$, are in contact with a voltage gradient at least as great as the critical voltage gradient $G_{MIN}$, wherein the set voltage threshold value $V_{T3}$ is calculated by adding the minimum voltage that illuminates said at least one third LED and the voltage drop across said third LED resister that results from the current through said at least one third LED at that minimum voltage; and means for providing a notice when said at least one of said LEDs is illuminated.

14. The voltage gradient detector of claim 13 wherein said first, second, and third pairs of electrodes are positioned such that, the second axis is inclined to the first axis by an angle of between 80° and 100°; and the third axis is inclined to the first axis by an angle of between 80° and 100°, and is inclined to the second axis by an angle of between 80° and 100°.

15. The voltage gradient detector of claim 14 wherein each of said first, second, and third pairs of electrodes has a discrete electrode and a common electrode, and wherein said common electrode is connected to each of, said means for electrically connecting said at least one first LED, said means for electrically connecting said at least one second LED, and said means for electrically connecting said at least one third LED.

\* \* \* \* \*